(12) United States Patent
Chen et al.

(10) Patent No.: US 7,066,244 B2
(45) Date of Patent: Jun. 27, 2006

(54) TEMPERATURE-HOMOGENIZING DEVICE

(75) Inventors: Yin-Yuan Chen, Taoyuan Hsien (TW); Wen-Ching Wu, Taoyuan Shien (TW); Jui-Yuan Hsu, Taoyuan Shien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 121 days.

(21) Appl. No.: 10/756,064

(22) Filed: Jan. 13, 2004

(65) Prior Publication Data
US 2005/0006083 A1   Jan. 13, 2005

(30) Foreign Application Priority Data
Jul. 2, 2003 (TW) .................... 92118115 A

(51) Int. Cl.
*F28F 7/00* (2006.01)

(52) U.S. Cl. ..................................... 165/185

(58) Field of Classification Search ............... 165/185, 165/46
See application file for complete search history.

(56) References Cited

U.S. PATENT DOCUMENTS

| | | | |
|---|---|---|---|
| 4,524,757 A * | 6/1985 | Buckley ...................... 165/46 |
| 4,563,375 A * | 1/1986 | Ulrich ......................... 165/46 |
| 4,580,619 A * | 4/1986 | Aitken ........................ 165/46 |
| 4,646,815 A * | 3/1987 | Iwata et al. ................. 165/170 |
| 4,997,032 A * | 3/1991 | Danielson et al. ............ 165/46 |
| 5,205,348 A * | 4/1993 | Tousignant et al. ........... 165/46 |
| 5,685,363 A * | 11/1997 | Orihira et al. ................ 165/46 |
| 6,241,005 B1 * | 6/2001 | Risca .......................... 165/46 |
| 2004/0118551 A1 * | 6/2004 | Czubarow et al. .......... 165/185 |

* cited by examiner

*Primary Examiner*—Teresa J. Walberg
(74) *Attorney, Agent, or Firm*—Madson & Austin

(57) ABSTRACT

A temperature-homogenizing device for uniformly dissipating heat generated from electronic components in an electronic device to a housing of the electronic device includes a first and a second higher thermally conductive layers and a first lower thermally conductive layer. The first lower thermally conductive layer is disposed between the first and the second higher thermally conductive layers, and made of a material or a medium having a lower thermal conductivity than each of the first and the second higher thermally conductive layers. By means of this temperature-homogenizing device, the heat is homogeneously distributed throughout the first and the second higher thermally conductive layers at a higher thermal conduction rate and transferred through the first lower thermally conductive layer at a lower thermal conduction rate so as to maintain homogeneous temperature distribution on the housing.

20 Claims, 7 Drawing Sheets

US 7,066,244 B2

TEMPERATURE-HOMOGENIZING DEVICE

FIELD OF THE INVENTION

The present invention relates to a temperature-homogenizing device, and more particularly to a temperature-homogenizing device for enhancing homogenous temperature distribution of an electronic device, which is suitable for uniformly dissipating heat generated from electronic components in the electronic device to the housing.

BACKGROUND OF THE INVENTION

Power adapters or power supply apparatuses are indispensable electronic devices for many kinds of electrical apparatuses and information apparatuses. As is known in the art, several electronic components are mounted on a printed circuit board, which is accommodated in a power adapter or a power supply apparatus. When the power supply apparatus operates, these electronic components generate energy in the form of heat with higher or lower power. If the generated heat is not effectively transferred to the surrounding or dissipated by other suitable means, the excessive heat or the locally elevated temperature might result in the failure of the electronic components or the breakdown of the whole product. Furthermore, the locally elevated temperature on the external wall of the housing leads to some problems impairing safety.

For example, the printed circuit board of the power supply apparatus has mounted thereon many higher and lower power electronic components. The higher power electronic components includes, without limitation, transformers, metal-oxide-semiconductor field effect transistors (MOSFETs), bare dice, diodes, inductors or windings. The lower power electronic components includes for example capacitors or resistors. Since the higher power electronic components are disposed at very short distances between each other, a local region of the power supply apparatus has an extremely high temperature. The extremely high temperature on the external surface of the housing may burn the user or ignite articles in contact therewith, for example papers, tablecloths, etc.

Please refer to FIG. 1, which schematically illustrates a cross-section of a power supply apparatus. Within the housing 10 of the power supply apparatus, a printed circuit board 11 is disposed. Many electronic components are mounted on the printed circuit board 11. For neat drawings, however, only two electronic components 12 and 13 indicating a higher and a lower heat generation sites, respectively, are shown in the drawing. When the power supply apparatus operates, the electronic components 12 and 13 generate energy in the form of heat with higher or lower power such that a higher temperature $T_H$ and a lower temperature $T_L$ are produced thereon. When the heat generated from the electronic components 12 and 13 transfers to the housing 10 via the air layer 14, the temperatures of the regions 16 and 17 above the electronic components 12 and 13 are also higher and lower, respectively. Therefore, the region 16 has a locally elevated temperature. Such locally elevated temperature may result in safety problems, for example the user is burnt or even a fire accident occurs. The conventional method for enhancing homogenous temperature distribution is implemented by attaching a heat sink (not shown) on the top surface of the higher power electronic component 12 in order to increase the heat transfer area. However, such method fails to effectively reduce the locally elevated temperature on the external surface of the housing.

SUMMARY OF THE INVENTION

It is an object of the present invention to provide a temperature-homogenizing device for enhancing homogenous temperature distribution of an electronic device, which is suitable for uniformly dissipating heat generated from electronic components in the electronic device to the housing.

It is another object of the present invention to provide a temperature-homogenizing device, which is advantageous for minimizing the locally elevated temperature on the external surface of the housing so as to impart safety during the electrical apparatus operates.

In accordance with a first aspect of the present invention, there is provided a temperature-homogenizing device for uniformly dissipating heat generated from electronic components in an electronic device to a housing of the electronic device. The temperature-homogenizing device includes a first and a second higher thermally conductive layers and a first lower thermally conductive layer. The first lower thermally conductive layer is disposed between the first and the second higher thermally conductive layers, and made of a material or a medium having a lower thermal conductivity than each of the first and the second higher thermally conductive layers. By means of this temperature-homogenizing device, the heat is homogeneously distributed throughout the first and the second higher thermally conductive layers at a higher thermal conduction rate and transferred through the first lower thermally conductive layer at a lower thermal conduction rate so as to maintain homogeneous temperature distribution on the housing.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention relates to a temperature-homogenizing device. The present invention will now be described more specifically with reference to the following embodiments relating to a power supply apparatus. However, the following descriptions of preferred embodiments of this invention are presented herein for purpose of illustration and description only; it is not intended to be exhaustive or to be limited to the precise form disclosed. For example, the concept of the present invention can be applied to a power adapter.

Figure 1:
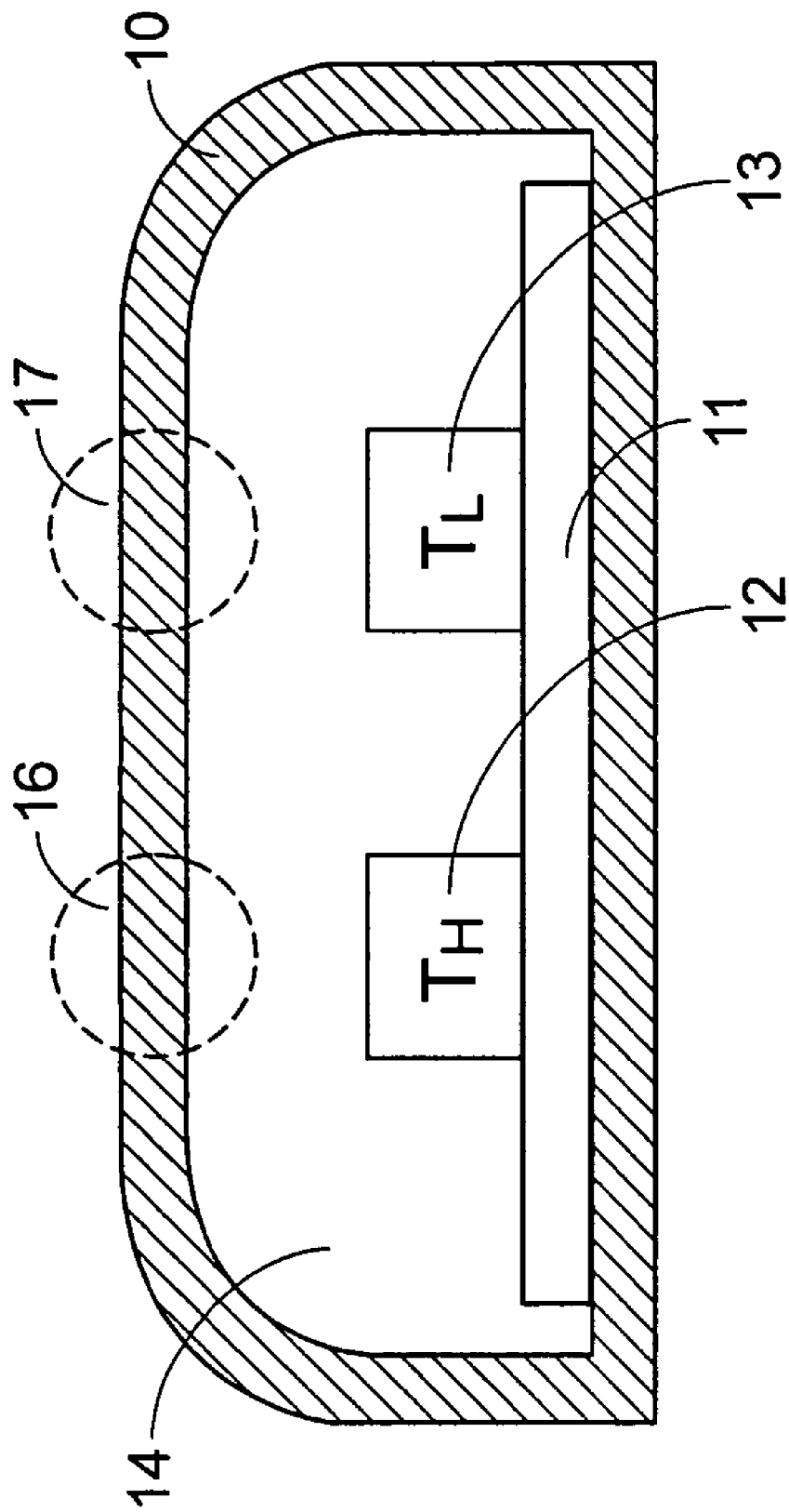
FIG. 1 is a schematic view illustrating a cross-section of a power supply apparatus according to prior art.
Figure 2:
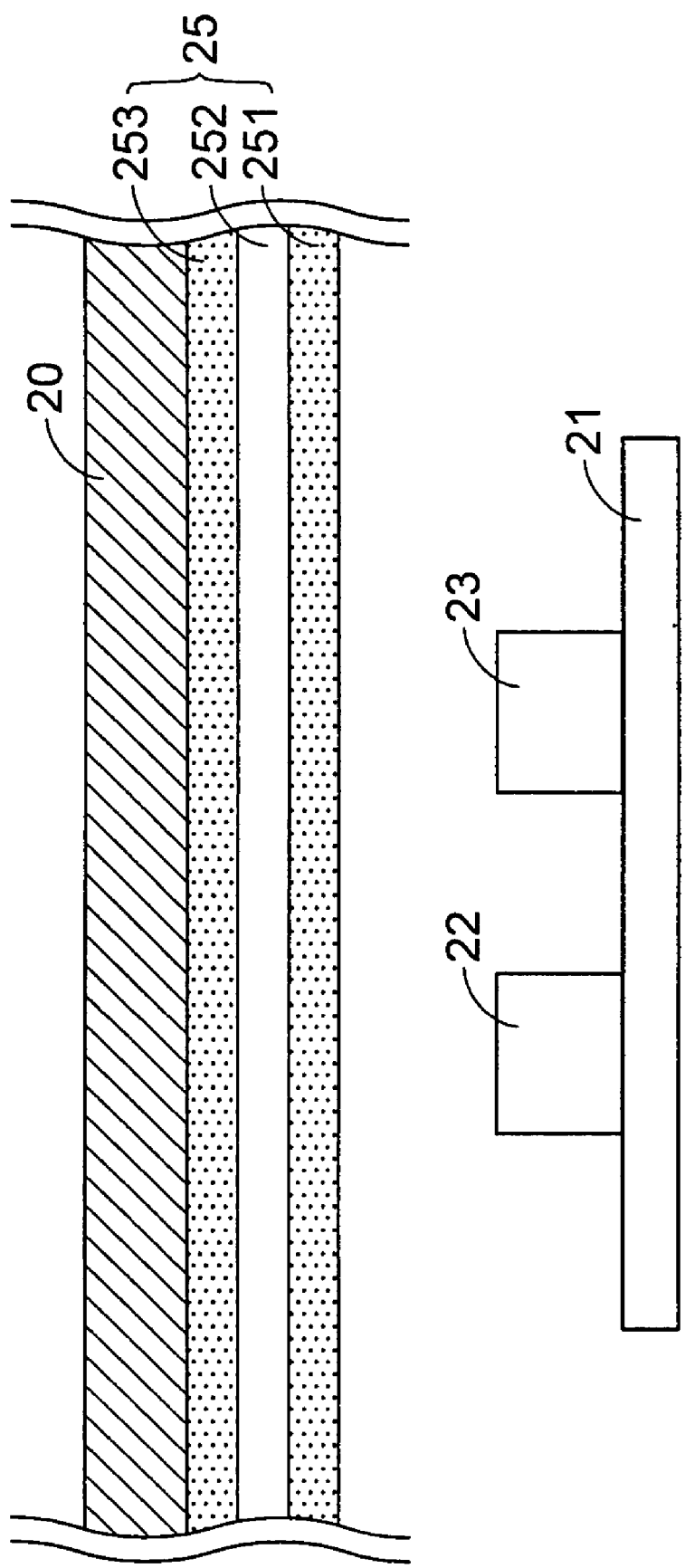
FIGS. 2~7 are schematic views illustrating temperature-homogenizing devices used in a power supply apparatus according to several preferred embodiments of the present invention.

Please refer to FIG. 2, which schematically illustrates a temperature-homogenizing device used in a power supply apparatus. A printed circuit board 21 is disposed with the housing 20 of the power supply apparatus. Many electronic components are mounted on the printed circuit board 21. For neat drawings, however, only two electronic components 22 and 23 indicating a higher and a lower heat generation sites, respectively, are shown in the drawing. The higher power electronic components include, without limitation, transformers, MOSFETs, bare dice, diodes, inductors or windings. The lower power electronic components include for example capacitors or resistors.

The temperature-homogenizing device 25 according to a preferred embodiment of the present invention comprises a first higher thermally conductive layer 251, a first lower thermally conductive layer 252 and a second higher thermally conductive layer 253. The first higher thermally conductive layer 251 and the second higher thermally conductive layer 253 can be made of identical or different materials or medium layers, and each has a higher thermal conductivity than the first lower thermally conductive layer 252. For example, the first higher thermally conductive layer 251 and the second higher thermally conductive layer 253 can be made of copper, aluminum, graphite or other material or medium having a higher thermal conductivity. Furthermore, the first lower thermally conductive layer 252 is made of a material or a medium having a lower thermal conductivity, such as general purpose plastic, glass, air or other material or medium having a lower thermal conductivity.

In the embodiment of FIG. 2, the first lower thermally conductive layer 252 is disposed between the first higher thermally conductive layer 251 and the second higher thermally conductive layer 253. Therefore, the heat generated from the electronic components 22 and 23 during operation is firstly transferred to the first higher thermally conductive layer 251. Since the first higher thermally conductive layer 251 has a higher thermal conductivity than the first lower thermally conductive layer 252, once the heat generated from the electronic components 22 and 23 is transferred to the first higher thermally conductive layer 251, the heat is horizontally distributed throughout the first higher thermally conductive layer 251 rapidly. Whereas, since the first lower thermally conductive layer 252 is disposed adjacent to the first higher thermally conductive layer 251 and has a lower thermal conductivity than that of the first higher thermally conductive layer 251 or the second higher thermally conductive layer 253, the heat transferred from the first higher thermally conductive layer 251 will be distributed throughout the first lower thermally conductive layer 252 at a relatively slower thermal conduction rate. Because the first lower thermally conductive layer 252 slows down the thermal conduction rate in the vertical direction, the heat can be more homogeneously distributed in the first higher thermally conductive layer 251 so as to provide an initial effect of enhancing homogenous temperature distribution.

The heat from the first lower thermally conductive layer 252 will then be transferred to the second higher thermally conductive layer 253. According to the similar heat conduction mechanism, the heat is horizontally distributed throughout the second higher thermally conductive layer 253 rapidly, and then the heat will be transferred to the surface of the housing 20 at a relatively shorter thermal conduction rate. Since the thermal conduction rates in the horizontal and the vertical directions are considerably distinguished, the heat generated from the electronic components at the higher and the lower heat generation sites will be homogeneously distributed by the temperature-homogenizing device 25 at first, and then transferred to the surface of the housing 20 for advanced heat dissipation. The technology provided by the present invention can effectively minimize the locally elevated temperature, and thus maintain homogenous temperature distribution on the external surface of the housing 20 of the power supply apparatus.

Furthermore, in order to obtain a higher thermal conduction rate in the horizontal direction than that in the vertical direction, the thermal conductivity ratio of the first higher thermally conductive layer 251 or the second higher thermally conductive layer 253 to the first lower thermally conductive layer 252 is greater than 3. This thermal conductivity ratio can be determined by adjusting the material or medium of the first higher thermally conductive layer 251, the second higher thermally conductive layer 253 and the first lower thermally conductive layer 252. For example, the first higher thermally conductive layer 251 or the second higher thermally conductive layer 253 can be made of aluminum, copper or brass, which has a thermal conductivity of 200, 400 and 116 W/mK, respectively. Whereas, the first lower thermally conductive layer 252 can be made of general purpose plastic, which has a considerably low thermal conductivity such as 0.2 W/mK. Thus, the thermal conductivity ratio of the first higher thermally conductive layer 251 or the second higher thermally conductive layer 253 to the first lower thermally conductive layer 252 is approximately 1,000, thereby obtaining an optimized homogenous temperature distribution.

Figure 3:
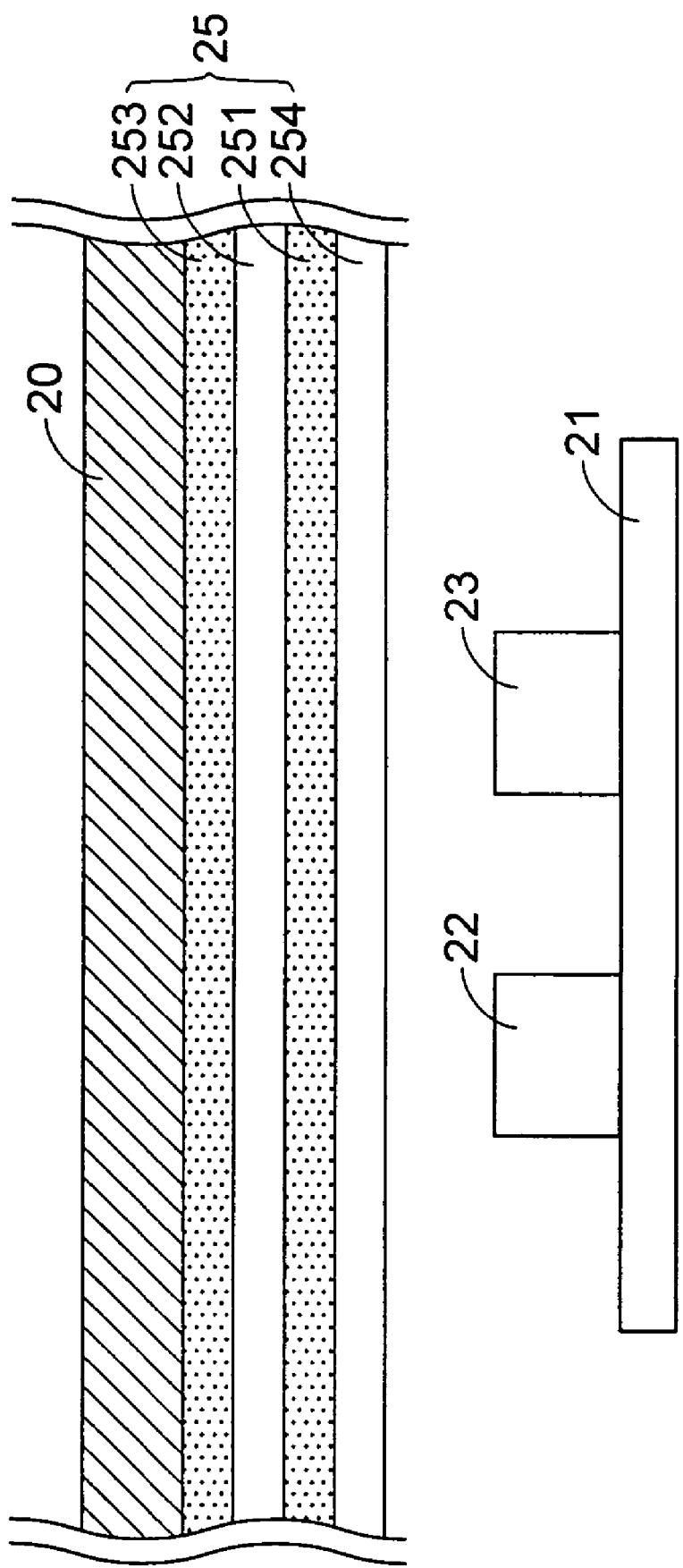

Referring to FIG. 3, the temperature-homogenizing device 25 used in this embodiment is similar to that of FIG. 2, except that a second lower thermally conductive layer 254 is further included. The second lower thermally conductive layer 254 is disposed adjacent to the first higher thermally conductive layer 251 but opposed to the first lower thermally conductive layer 252. Alternatively, the second lower thermally conductive layer 254 can be disposed adjacent to the second higher thermally conductive layer 253 but opposed to the first lower thermally conductive layer 252 (not shown). The second lower thermally conductive layer 254 and the first lower thermally conductive layer 252 can be made of similar or different material or medium having a lower thermal conductivity, such as general purpose plastic, glass, air or other material or medium having a lower thermal conductivity. Since the second lower thermally conductive layer 254 is made of insulating material or medium having a lower thermal conductivity, when the second lower thermally conductive layer 254 is directly exposed to the electronic components 22 and 23 during operation, the second lower thermally conductive layer 254 can not only function as the first lower thermally conductive layer 252 but also isolate the electronic components in the power supply apparatus. The total size of the power supply apparatus can be minimized accordingly.

Figure 4:
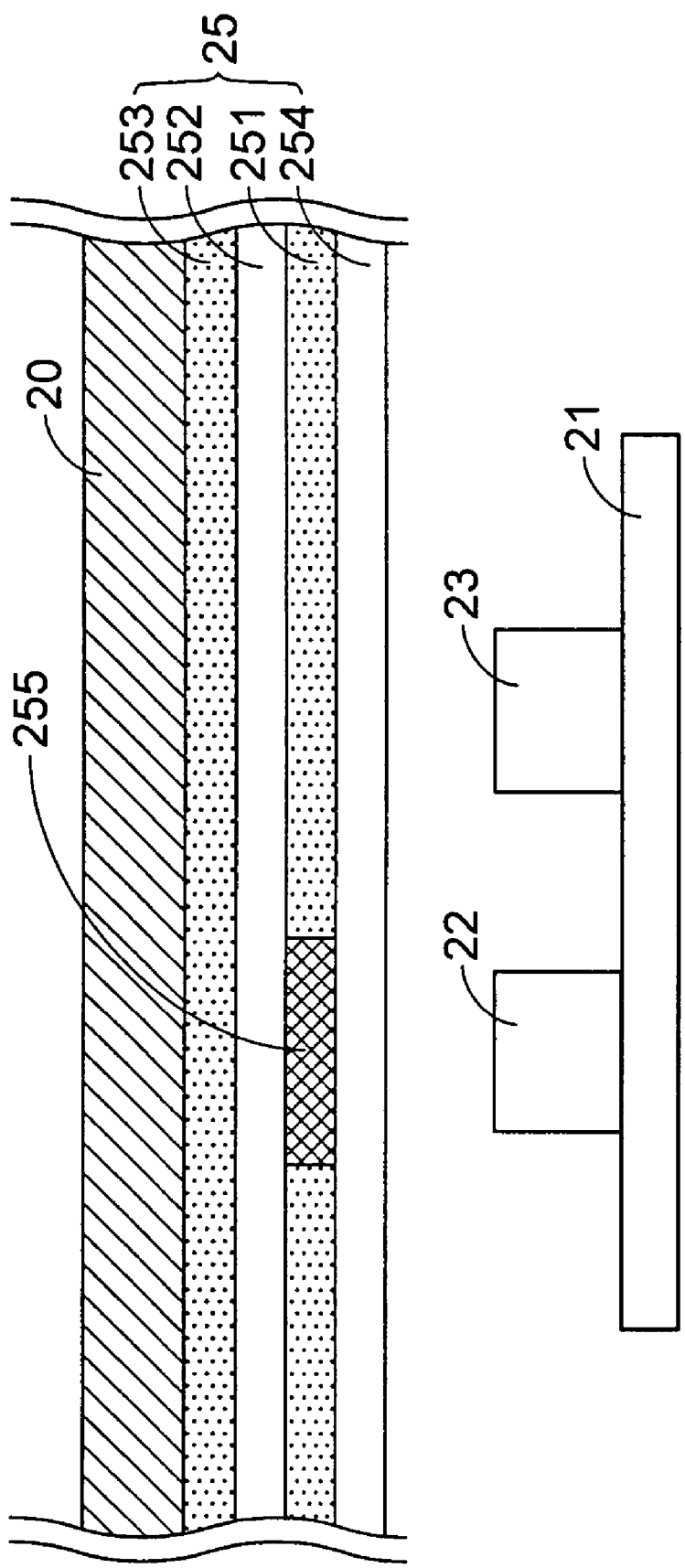

Referring to FIG. 4, the temperature-homogenizing device 25 used in this embodiment is similar to that of FIG. 3, except that a third lower thermally conductive layer 255 is further included. The third lower thermally conductive layer 255 can be imbedded into the first higher thermally conductive layer 251, the first lower thermally conductive layer 252, the second higher thermally conductive layer 253 or the second lower thermally conductive layer 254 and disposed above/on a location in the vicinity of the high power electronic component 22. Likewise, the third lower thermally conductive layer 255 is made of material or medium having a lower thermal conductivity, such as general purpose plastic, glass, air or other material or medium having a lower thermal conductivity, and preferably air. When the third lower thermally conductive layer 255 is imbedded into the first higher thermally conductive layer 251 or the second higher thermally conductive layer 253, the third lower thermally conductive layer 255, the first lower thermally conductive layer 252 and the second lower thermally conductive layer 254 can be made of similar or different material or medium having a lower thermal conductivity than that of the first higher thermally conductive layer 251 or the second higher thermally conductive layer 253, such as general purpose plastic, glass, air or other material or medium having a lower thermal conductivity. When the third lower thermally conductive layer 255 is imbedded into the first lower thermally conductive layer 252 or the second lower thermally conductive layer 254, the third lower thermally conductive layer 255 is preferably made of a material or a medium having a lower thermal conductivity than the first higher thermally conductive layer 251 or the second higher thermally conductive layer 253, such as air.

Since the third lower thermally conductive layer 255 is disposed in the vicinity of the higher power electronic component 22, when the heat generated from the higher power electronic component 22 transfers to the third lower thermally conductive layer 255, the thermal conduction rate in the vertical direction will be slowed down. The ratio of the thermal conduction rate in the horizontal direction to that in the vertical direction is increased, thereby achieving homogeneous temperature distribution on the housing of the power supply apparatus. It is of course that the concept of using the third lower thermally conductive layer 255 is not limited to the architecture described in FIG. 3. The similar technology can also be applied to the temperature-homogenizing device of FIG. 2.

Figure 5:
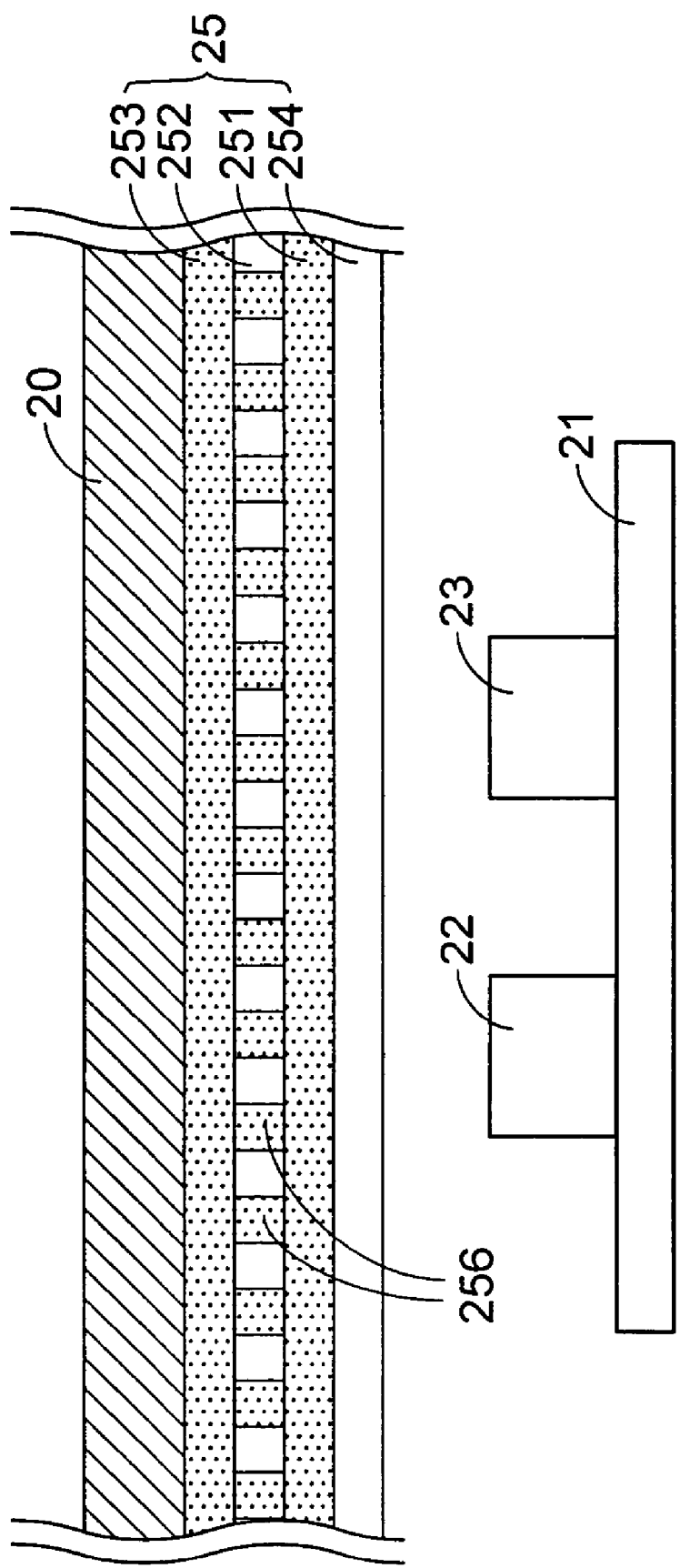

Referring to FIG. 5, the temperature-homogenizing device 25 used in this embodiment is similar to that of FIG. 3, except that a plurality of pillars 256 are disposed in the first lower thermally conductive layer 252, wherein the height of these pillars 256 may be equal or unequal. In addition, the pillar 256, the first higher thermally conductive layer 251 and the second higher thermally conductive layer 253 can be made of identical or different materials or medium layers, and selected from copper, aluminum, graphite or other material or medium having a higher thermal conductivity. Since the pillars 256 are disposed in the first lower thermally conductive layer 252, the thermal conduction rate in the vertical direction will be slowed down by means of these pillars 256. Furthermore, a more homogeneous temperature distribution is achieved when the pillars 256 are uniformly distributed in the first lower thermally conductive layer 252.

Figure 6:
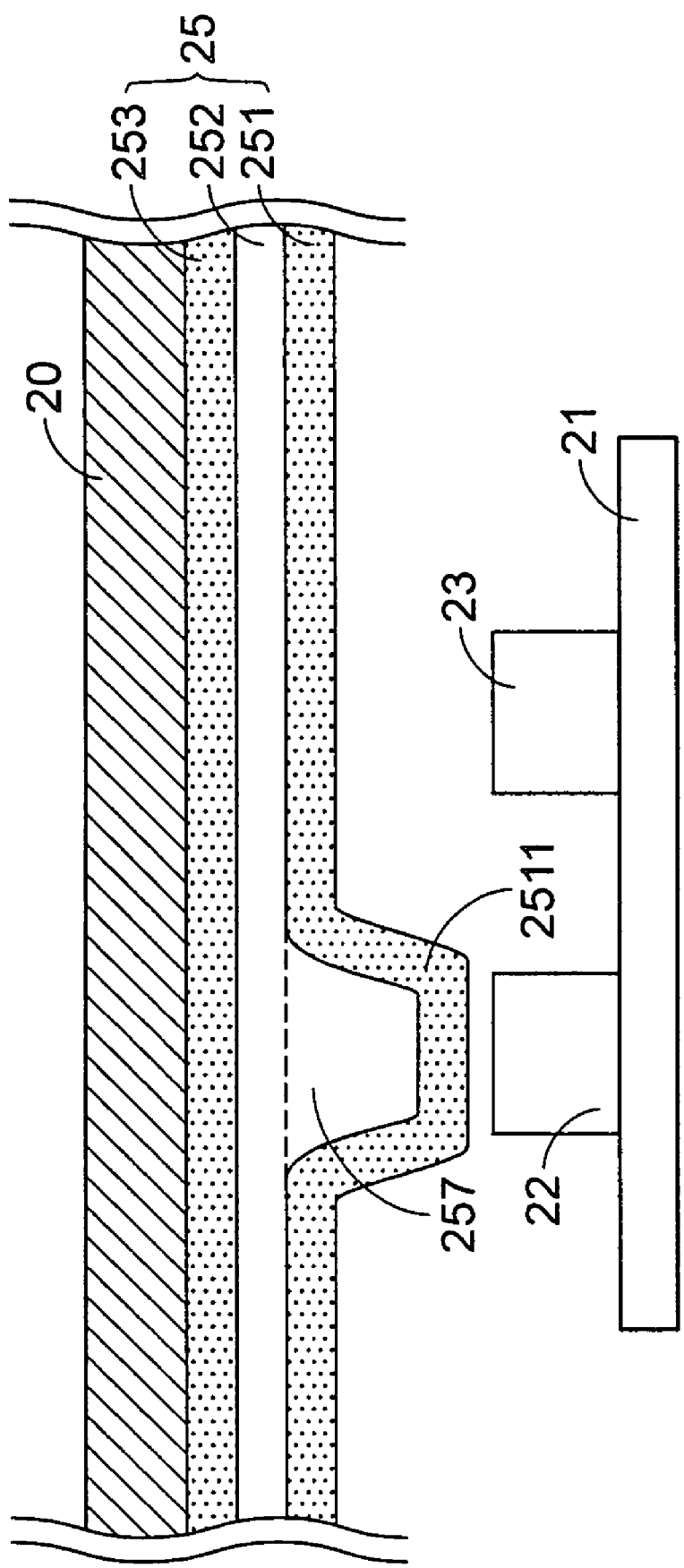

Referring to FIG. 6, the temperature-homogenizing device 25 used in this embodiment is similar to that of FIG. 2, except that at least one recess portion 2511 is provided on the first higher thermally conductive layer 251 and a fourth lower thermally conductive layer 257 is provided on the recess portion 2511. The fourth lower thermally conductive layer 257 and the first lower thermally conductive layer 253 can be made of identical or different materials or medium layers. The thermal conduction rate in the vertical direction will be slowed down by means of the fourth lower thermally conductive layer 257 so as to offer distinguishable thermal conduction rates in the horizontal and the vertical directions. A more homogeneous temperature distribution on the housing of the power supply apparatus is achieved accordingly. Alternatively, the recess portion 2511 of the first higher thermally conductive layer 251 can be in contact with or in the vicinity of the higher power electronic component 22 so as to shorten the distance between the higher power electronic component 22 and the first higher thermally conductive layer 251. Therefore, the heat in the higher heat generation site can be rapidly transferred and distributed throughout the first higher thermally conductive layer 251, thereby achieving more homogeneous temperature distribution on the housing of the power supply apparatus.

Figure 7:
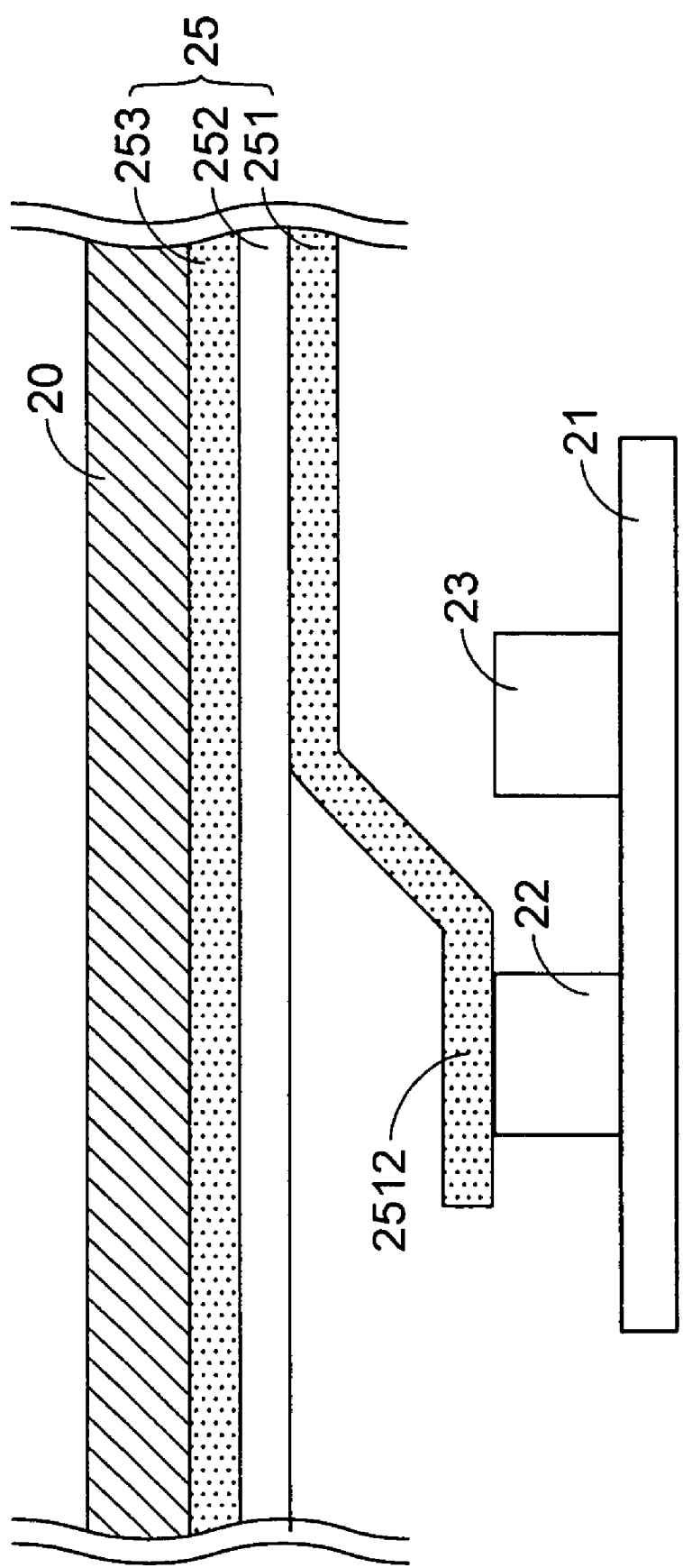

Referring to FIG. 7, the temperature-homogenizing device 25 used in this embodiment is similar to that of FIG. 6, except that one end 2512 of the first higher thermally conductive layer 251 in contact with or in the vicinity of the higher power electronic component 22 so as to shorten the distance between the higher power electronic component 22 and the first higher thermally conductive layer 251. Therefore, the heat in the higher heat generation site can be rapidly transferred to the other end of the first higher thermally conductive layer 251. Furthermore, the space between the end 2512 of the first higher thermally conductive layer 251 and the first lower thermally conductive layer 252 is an air layer, which is also advantageous for slowing thermal conduction rate in the vertical direction, thereby achieving more homogeneous temperature distribution on the housing of the power supply apparatus.

While the invention has, been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device having a temperature-homogenizing device comprising:
   a housing;
   a plurality of electronic components disposed in said housing; and
   a temperature-homogenizing device, comprising:
   a first and a second higher thermally conductive layers, wherein said second higher thermally conductive layer is adjacent to said housing; and
   a first lower thermally conductive layer disposed between said first and said second higher thermally conductive layers, and made of a material or a medium having a lower thermal conductivity than each of said first and said second higher thermally conductive layers, such that heat generated from said electronic components is homogeneously distributed throughout said first and said second higher thermally conductive layers at a higher thermal conduction rate and transferred through said first lower thermally conductive layer at a lower thermal conduction rate so as to uniformly transfer said heat to said housing and maintain homogeneous temperature distribution on said housing.

2. The electronic device according to claim 1 wherein each of said first and said second higher thermally conductive layers is made of a material or medium selected from a group consisting of copper, aluminum and graphite.

3. The electronic device according to claim 2 wherein said first and said second higher thermally conductive layers are made of an identical material or medium.

4. The electronic device according to claim 1 wherein said first lower thermally conductive layer is made of a material or medium selected from a group consisting of general purpose plastic, glass and air.

5. The electronic device according to claim 1 further comprising a second lower thermally conductive layer adjacent to said first higher thermally conductive layer but opposed to said first lower thermally conductive layer.

6. The electronic device according to claim 1 further comprising a second lower thermally conductive layer adjacent to said second higher thermally conductive layer but opposed to said first lower thermally conductive layer.

7. The electronic device according to claim 6 wherein said second lower thermally conductive layer is made of a material or medium selected from a group consisting of general purpose plastic, glass and air.

8. The electronic device according to claim 7 wherein said first and said second lower thermally conductive layers are made of an identical material or medium.

9. The electronic device according to claim 8 further comprising a third lower thermally conductive layer imbedded into one of said first higher thermally conductive layer, said first lower thermally conductive layer, said second higher thermally conductive layer and said second lower thermally conductive layer and disposed in the vicinity of said electronic component so as to slow down the thermal conduction rate in the vertical direction.

10. The electronic device according to claim 9 wherein when said third lower thermally conductive layer is imbedded into one of said first and said second lower thermally conductive layers, said third lower thermally conductive layer has a lower thermal conductivity than that of each of said first and said second lower thermally conductive layer.

11. The electronic device according to claim 10 wherein said third lower thermally conductive layer is an air layer.

12. The electronic device according to claim 9 wherein when said third lower thermally conductive layer is imbedded into one of said first and said second higher thermally conductive layers, said first, said second and said third lower thermally conductive layers are made of an identical material or medium.

13. The electronic device according to claim 12 wherein said third lower thermally conductive layer is made of a material or medium selected from a group consisting of general purpose plastic, glass and air.

14. The electronic device according to claim 1 further comprising a plurality of pillars disposed in said first lower thermally conductive layer so as to adjust the thermal conduction rate in the vertical direction.

15. The electronic device according to claim 14 wherein said plurality of pillars have equal height.

16. The electronic device according to claim 14 wherein said plurality of pillars are made of a material or medium selected from a group consisting of copper, aluminum and graphite.

17. The electronic device according to claim 16 wherein said plurality of pillars, said first and said higher thermally conductive layers are made of an identical material or medium.

18. The electronic device according to claim 1 wherein at least a recess portion is provided on said first higher thermally conductive layer, and a fourth lower thermally conductive layer is provided on said recess portion so as to slow down the thermal conduction rate in the vertical direction.

19. The electronic device according to claim 18 wherein said fourth and said first lower thermally conductive layers are made of an identical material or medium.

20. The electronic device according to claim 1 wherein a portion of said first higher thermally conductive layer is in contact with or in the vicinity of said electronic components.

* * * * *